(12) United States Patent
Zhang et al.

(10) Patent No.: US 9,751,104 B2
(45) Date of Patent: Sep. 5, 2017

(54) APPARATUS FOR SUBSTRATE DOUBLE-SURFACE HOLE-FILLING

(71) Applicants: NANCHANG O-FILM TECH CO., LTD, Nanchang (CN); SUZHOU O-FILM TECH CO., LTD., Suzhou (CN); SHENZHEN O-FILM TECH CO., LTD., Shenzhen (CN)

(72) Inventors: Sheng Zhang, Shenzhen (CN); Yulong Gao, Shenzhen (CN)

(73) Assignees: Nanchang O-Film Tech Co., Ltd., Nanchang (CN); Shenzhen O-Film Tech Co., Ltd., Shenzhen (CN); Suzhou O-Film Tech Co., Ltd., Suzhou (CN)

( * ) Notice: Subject to any disclaimer, the term of this patent is extended or adjusted under 35 U.S.C. 154(b) by 316 days.

(21) Appl. No.: 13/968,354

(22) Filed: Aug. 15, 2013

(65) Prior Publication Data

US 2014/0373776 A1 Dec. 25, 2014

Related U.S. Application Data

(63) Continuation of application No. PCT/CN2013/079205, filed on Jul. 11, 2013.

(30) Foreign Application Priority Data

Jun. 19, 2013 (CN) .......................... 2013 1 0243869

(51) Int. Cl.
*B05C 9/04* (2006.01)
*B05C 11/04* (2006.01)
(Continued)

(52) U.S. Cl.
CPC ................ *B05C 9/04* (2013.01); *B05C 11/04* (2013.01); *B05C 11/1039* (2013.01);
(Continued)

(58) Field of Classification Search
None
See application file for complete search history.

(56) References Cited

U.S. PATENT DOCUMENTS 2,117,432 A * 5/1938 Linscott .................. B05D 1/26
427/358
2,861,009 A * 11/1958 Rubner .................. B32B 27/00
118/415
(Continued)

FOREIGN PATENT DOCUMENTS

CN 102045952 A 5/2011
CN 102265713 A 11/2011
(Continued)

OTHER PUBLICATIONS

Taniguchi (JP 2010-228104), English translation.*
(Continued)

*Primary Examiner* — Charles Capozzi
(74) *Attorney, Agent, or Firm* — Hodgson Russ LLP

(57) ABSTRACT

The present invention provides a substrate double-surface hole-filling apparatus for carrying out a hole-filling operation on a substrate which has a first surface and a second surface, comprises a first feeding device, a first scraping device, a first drying device, a second feeding device, a second scraping device, a second drying device and a turnover device. The substrate double-surface hole-filling apparatus has a turnover device turning over the substrate which needs to be carried out with hole-filling operation. Therefore, the substrate double-surface hole-filling apparatus can automatically carry out the hole-filling operation on two surfaces of the substrate without manual turnover of the substrate, thus improving production efficiency.

6 Claims, 3 Drawing Sheets

(51) Int. Cl.
*B05C 11/10* (2006.01)
*B05C 5/02* (2006.01)
*H05K 3/12* (2006.01)

(52) U.S. Cl.
CPC .......... *B05C 5/0245* (2013.01); *B05C 11/048* (2013.01); *H05K 3/1258* (2013.01); *H05K 2203/0139* (2013.01)

(56) References Cited

U.S. PATENT DOCUMENTS

| | | | | |
|---|---|---|---|---|
| 2,961,342 | A * | 11/1960 | Snyder | B05D 7/04 427/381 |
| 5,674,556 | A * | 10/1997 | Fukumura et al. | 427/113 |
| 6,024,797 | A * | 2/2000 | Li et al. | 118/665 |
| 2003/0205201 | A1* | 11/2003 | Shida | H01M 4/0404 118/696 |
| 2010/0043700 | A1* | 2/2010 | Trefz | D21H 23/48 118/68 |
| 2010/0051223 | A1* | 3/2010 | Trefz | D21H 23/48 162/265 |

FOREIGN PATENT DOCUMENTS

| | | |
|---|---|---|
| CN | 102348335 A | 2/2012 |
| CN | 103002672 A | 3/2013 |
| EP | 1 302 247 A1 | 4/2003 |
| JP | 2004-098500 A | 4/2004 |
| JP | 2006-192325 A | 7/2006 |
| JP | 2010-228104 A | 10/2010 |
| TW | M297132 | 9/2006 |

OTHER PUBLICATIONS

Murano (JP 2004-098500), English translation.*
Chinese International Search Report of corresponding International PCT Application No. PCT/CN2013/079205, dated Mar. 27, 2014.
Korean Examination Report of corresponding Republic of Korea patent Application No. 10-2013-7025603, dated Oct. 27, 2014.
Chinese Taiwan Examination Report of corresponding Taiwan patent application No. 102130509, dated Jan. 30, 2015.

* cited by examiner

APPARATUS FOR SUBSTRATE DOUBLE-SURFACE HOLE-FILLING

CROSS-REFERENCE TO RELATED APPLICATIONS

This application is a continuation of International Application No. PCT/CN2013/079205, filed on Jul. 11, 2013, which claims priority to Chinese Patent Application No. 201310243869.4, filed on Jun. 19, 2013, both of which are hereby incorporated by reference in their entireties.

FIELD OF THE TECHNOLOGY

The present invention relates to a hole-filling apparatus, particularly to an apparatus for substrate double-surface hole-filling.

BACKGROUND

A hole-filling process is a process where a specific material is injected into a substrate in a manner of vacuum, rolling pressure or scraping pressure. The application fields of the hole-filling process include printed circuit board (PCB, Printed Circuit Board) and surface mounted technology (SMT, Surface Mounted Technology) thereof, as well as solar electrodes, etc. With the characteristics of easy realization and low cost, the hole-filling process has become one of the most common processes of filling holes and pits.

Currently, a mature hole-filling process for a substrate surface is mainly realized through two ways: one is a screen printing method, where a wire mesh screen or a steel mesh screen is laid on a substrate, a material is coated on the screen by rolling or scraping, and the hole-filling material selectively contacts pits through mesh holes; and the other is a rolling-coating hole-filling method, where a rolling-coating wheel directly coats the hole-filling material on the substrate, so as to achieve the purpose of hole filling.

When a common hole-filling apparatus adopts the above two hole-filling processes to carry out the hole-filling operation on the substrate, generally, only a single-surface hole-filling operation can be carried out. If a double-surface hole-filling operation is carried out, the substrate needs to be manually turned over after the hole-filling operation of one surface is completed, so as to carry out the hole-filling operation on the other surface. Such hole-filling apparatus has low degree of automation, thus having low production efficiency.

SUMMARY

In view of the above, the present invention provides an apparatus for substrate double-surface hole-filling, without a manual turnover operation but with the advantage of high production efficiency.

A substrate double-surface hole-filling apparatus for carrying out a hole-filling operation on a substrate, comprises a first feeding device, a first scraping device, a first drying device, a second feeding device, a second scraping device, a second drying device, and a turnover device, wherein the first feeding device and the first scraping device are positioned on the same side of a first surface of the substrate; the second feeding device and the second scraping device are positioned on the same side of a second surface of the substrate; the first feeding device adds a packing material used for hole-filling to the first surface of the substrate; the first scraping device fills the packing material added to the first surface of the substrate to concave holes or pits of the first surface of the substrate; the substrate filled with the packing material is dried by the first drying device; the turnover device turns over the substrate from a state which the first surface faces the first feeding device to another state which the second surface faces the second feeding device; the second feeding device adds the packing material used for hole-filling to the second surface of the substrate; the second scraping device fills the packing material added to the second surface of the substrate to concave holes or pits of the second surface of the substrate; the substrate filled with the packing material is dried by the second drying device; and the first scraping device and the second scraping device directly contact the substrate.

In one example, the turnover device comprises a plurality of turnover rollers, and the turnover rollers guide and turn over the substrate from a state which the first surface faces the first feeding device to another state which the second surface faces the second feeding device.

In one example, the number of the turnover rollers is at least two, and one turnover roller is provided between the first drying device and the second drying device, and the other turnover roller is arranged opposite the one turnover roller and positioned on one side of the second drying device.

In one example, the substrate double-surface hole-filling apparatus further comprises an unwinding device releasing the substrate which is wound and a winding device winding the substrate.

In one example, the substrate double-surface hole-filling apparatus further comprises a remaining material recycling device positioned on one side of the first scraping device or the second scraping device, and the remaining material recycling device recycles a remaining packing material on the surfaces of the substrate.

In one example, the remaining material recycling device is a suction type remaining material recycle device. The remaining material recycling device comprises a squeegee block for collecting the remaining material on the substrate, a suction material port positioned at an edge of the squeegee block, and a negative pressure suction pipe for guiding the remaining material collected at the suction material port away.

In one example, the negative pressure suction pipe is connected with the first feeding device or the second feeding device; and the remaining material recycled in the negative pressure suction pipe reflows back to the first feeding device or the second feeding device.

In one example, the substrate double-surface hole-filling apparatus further comprises a supporting device which is positioned below the first scraping device and the second scraping device and supports the substrate.

In one example, both of the first feeding device and the second feeding device are a charging device having a drip tube structure or a coating structure.

In one example, the first scraping device and the second scraping device are both a flexible squeegee or a steel squeegee or a combination of them.

The above substrate double-surface hole-filling apparatus has a turnover device for turning over the substrate which needs to be carried out with hole-filling operation. Therefore, the substrate double-surface hole-filling apparatus can automatically carry out the hole-filling operation on two surfaces of the substrate without manual turnover of the substrate, thus improving production efficiency.

DETAILED DESCRIPTION

Figure 1:
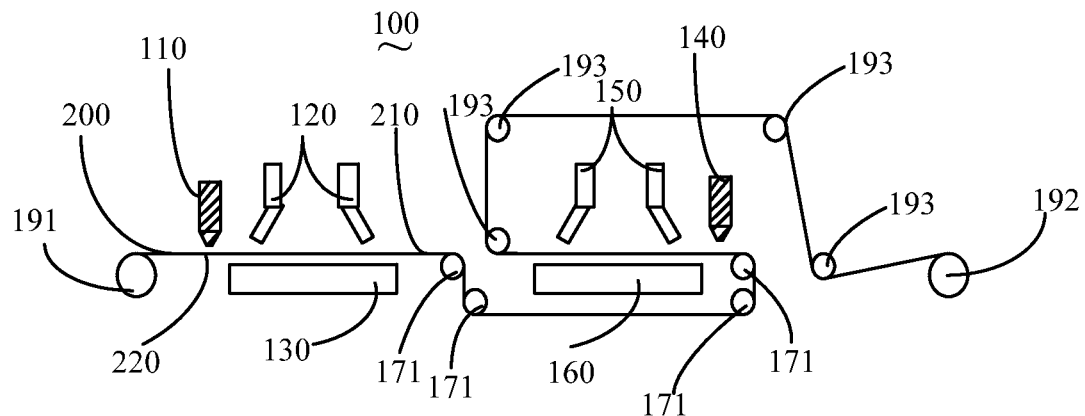
FIG. 1 is a schematic diagram of a substrate double-surface hole-filling apparatus according to an embodiment.
Figure 2:
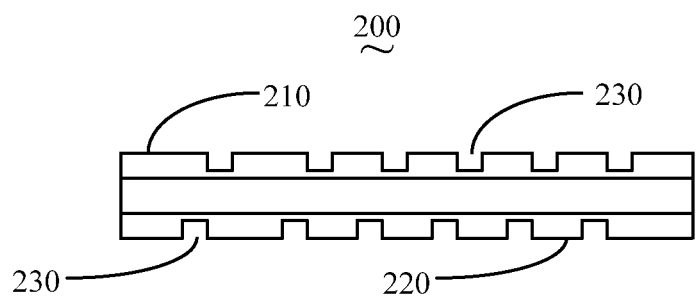
FIG. 2 is a schematic diagram of a substrate according to an embodiment.

Referring to FIG. 1, in an embodiment, a substrate double-surface hole-filling apparatus 100 is provided. The substrate double-surface hole-filling apparatus 100 is used for carrying out a hole-filling operation on a substrate 200 which has a first surface 210 and a second surface 200. The first surface 210 and the second surface 220 of the substrate 200 both have holes or pits, for example, pits 230 in FIG. 1, which may be grooves or circular slots, etc.

The substrate double-surface hole-filling apparatus 100 comprises a first feeding device 110, a first scraping device 120, a first drying device 130, a second feeding device 140, a second scraping device 150, a second drying device 160, a turnover device, an unwinding device 191 and a winding device 192.

The first feeding device 110, the first scraping device 120, the second feeding device 140, the second scraping device 150 of the substrate double-surface hole-filling apparatus 100 are all provided above the substrate 200 which needs hole-filling operation. The first feeding device 110 adds a packing material for hole-filling to the first surface 210 of the substrate 200. The first scraping device 120 fills the packing material added to the first surface 210 of the substrate 200 to pits 230 of the first surface 210 of the substrate 200. The substrate 200 filled with the packing material is dried by the first drying device 130. The turnover device turns over the substrate 200 from a state which the first surface 210 faces the first feeding device 110 to another state which the second surface 220 faces the second feeding device 140. The second feeding device 140 adds the packing material for hole-filling to the second surface 220 of the substrate 200. The second scraping device 150 fills the packing material added to the second surface 220 of the substrate 200 to pits 230 of the second surface 220 of the substrate 200. The substrate 200 filled with the packing material is dried by the second drying device 160. The first scraping device 120 and the second scraping device 150 directly contact the substrate 200.

In the embodiment, the first feeding device 110 and the second feeding device 140 can both be a charging device having a drip tube structure or a coating structure. The first feeding device 110 and the second feeding device 140 drip or coat the packing material on the substrate 200. The first scraping device 120 and the second scraping device 150 are both a flexible squeegee or a steel scraper or a combination of them, and the first scraping device 120 and the second scraping device 150 directly contact the substrate 200. Namely, the first scraping device 120 and the second scraping device 150 may contain only the flexible squeegees or the steel scrapers and also may be a scraping device which has the flexible squeegee and the steel scraper at the same time. The first scraping device 120 and the second scraping device 150 scrape and coat the packing material on the substrate 200 into the pits 230. Here, the packing material may be a conductive material or a color ink.

The unwinding device 191 of the substrate double-surface hole-filling apparatus 100 is used for releasing the wound substrate. The winding device 192 is used for winding the substrate 200.

The turnover device of the substrate double-surface hole-filling apparatus 100 comprises a plurality of turnover rollers 171 and plurality of guiding wheels 193. The turnover rollers 171 guide and turn over the substrate 200 from a state which the first surface 210 faces the first feeding device 110 to another state which the second surface 220 faces the second feeding device 140. The guiding wheels 193 guide the turned substrate 200 to the winding device 192 and the substrate 200 is wound by the winding device 192. As shown in the FIG. 1, when the substrate 200 released from the unwinding device 19 passes through the first feeding device 110 and the first scraping device 120, the first surface 210 of the substrate 200 faces the first feeding device 110. Therefore, it is convenient for the first feeding device 110 to add the packing material to the first surface 210, and it is also convenient for the first scraping device 120 to carry out the scraping operation on the packing material on the first surface 210. After the hole-filling operation of the first surface 210 of the substrate 200 is completed, the hole-filling operation needs to be carried out on the second surface 220. At this time, the turnover rollers 171 guide and turn over the substrate 200. With four the turnover rollers 171, the second surface of the substrate 200 may be turned to face the second feeding device 140. The four guiding wheels 193 may guide the substrate 200 to the winding device 192 so as to wind the substrate 200 which completes the hole-filling operation.

Figure 7:
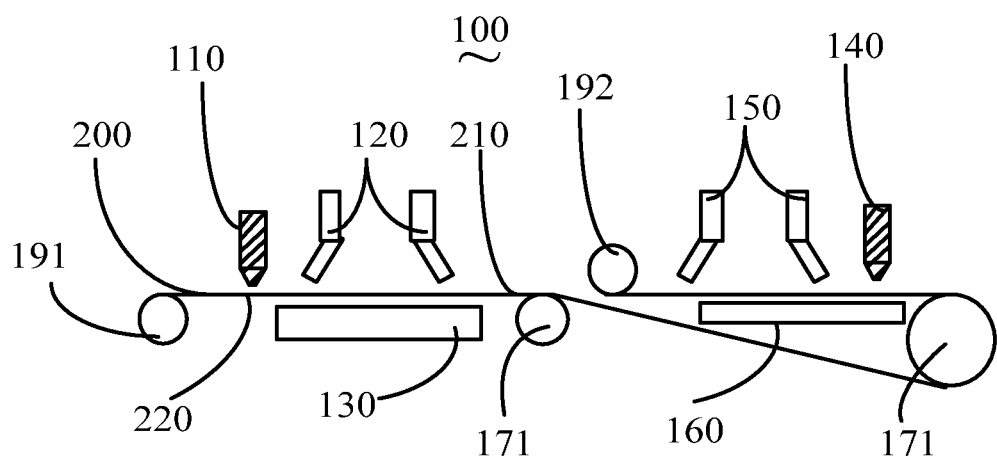
FIG. 7 is a schematic diagram of the substrate double-surface hole-filling apparatus in FIG. 1 when guiding wheels and some of turnover rollers are omitted.

The position of the turnover rollers 171 may be suitably regulated and hence four guiding wheels 193 behind the second scraping device 150 can be omitted, or with a suitable adjustment, the number of four turnover rollers 171 before the second scraping device 150 can be reduced. Refer to FIG. 7, the substrate double-surface hole-filling apparatus 100 adopts two turnover rollers 171 and omits the guiding wheel 193. Here, two turnover rollers 171 are provided at the two sides of the second drying device 160. The winding device 192 moves to a position between the first drying device 130 and the second drying device 160. The substrate 200 passes around a front turnover roller 171 from above after it is released from the winding device 191. And then, the substrate passes around a back turnover roller 171 from below and is pulled back (namely, the substrate 200 is turned around at the back turnover roller 171). Finally, the substrate 200 is wound by the winding device 192. Therefore, the hole-filling operation also can be realized for the two surfaces of the substrate 200. In order to guarantee that the second drying device 160 has a relatively good set position and that the substrate before and after the turnover is at the same level, the back turnover roller 171 is disposed to be larger. Here, the forward and backward directions are defined according to the moving direction of the substrate 200. As the substrate 200 moves from the unwinding device 191 to the winding device 192, the direction toward the winding device 192 is defined as the backward direction, and the direction toward the unwinding device 191 is defined as the forward direction.

Figure 3:
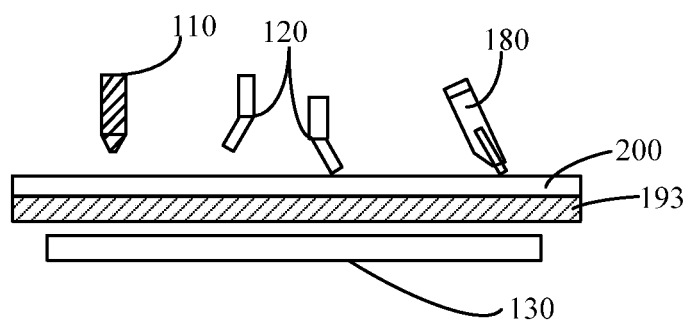
FIG. 3 is a schematic diagram of a partial structure of the substrate double-surface hole-filling apparatus of FIG. 1 after a remaining material recycling device is added.
Figure 4:
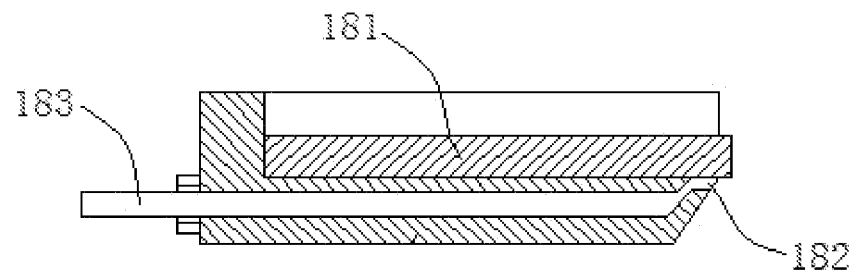
FIG. 4 is a schematic diagram of an internal structure of the remaining material recycling device in FIG. 3.

Referring to FIGS. 3 and 4, the substrate double-surface hole-filling apparatus 100 also includes a remaining material recycling device 180 provided above the substrate 200 and recycling the remaining packing material on the surface of the substrate 200, and a supporting device 193 supporting the substrate 200. The remaining material recycling device 180 is a suction type remaining material recycle device. The remaining material recycling device 180 comprises a squeegee block 181 collecting the remaining material on the substrate 200, a suction material port 182 positioned at an edge of the squeegee block 181, and a negative pressure suction pipe 183 guiding the remaining material collected at the suction material port 182 away. The remaining material recycled in the negative pressure suction pipe 183 reflows back to the first feeding device 110 or the second feeding device 140. Therefore, the material may be saved. The supporting device 193 is positioned below the first scraping device 120 and the second scraping device 150 and may support the substrate 200 when the scraping operation is carried out, so that the scraping operation is conveniently carried out.

The working process of the substrate double-surface hole-filling apparatus 100 will be described in the following.

Figure 5:
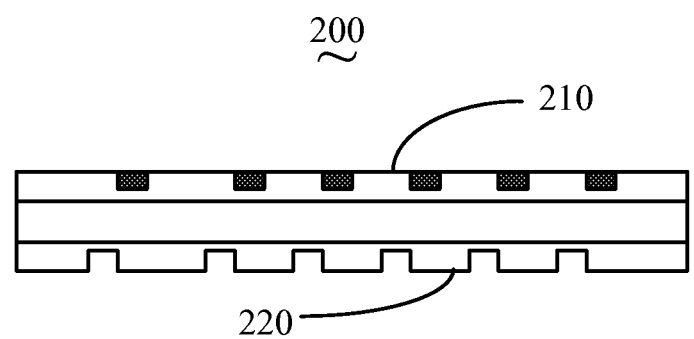
FIG. 5 is a schematic diagram of the substrate in FIG. 2 after a hole-filling process is carried out on a first surface.
Figure 6:
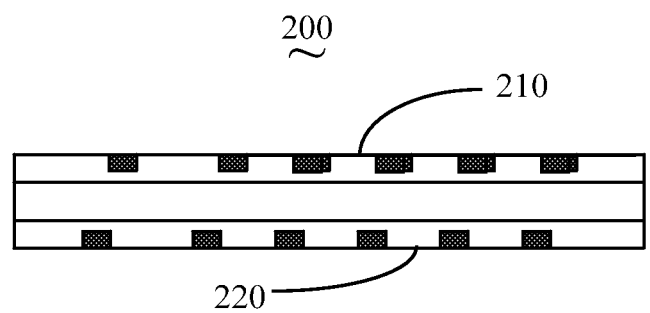
FIG. 6 is a schematic diagram of the substrate in FIG. 2 after the hole-filling process is carried out on a first surface and a second surface.

Referring to FIG. 1, firstly, the substrate 200 provided on the unwinding device 191 is released from the unwinding device 191; when the substrate 200 passes through the first feeding device 110 and the first scraping device 120, the first feeding device 110 adds the packing material to the first surface 210 of the substrate 200; then, the first scraping device 120 evenly scrapes the packing material on the first surface 210 of the substrate 200 to the pits 230 on the first surface 210; afterwards, the squeegee block 181 of the remaining material recycle device 180 collects the remaining material (that is, the remaining packing material) to the suction material port 182, and the negative suction pipe 183 sucks the remaining material collected at the suction material port 182 and guides it to the first feeding device 110 or the second feeding device 140; finally, the first drying device 130 dries the substrate 200 such that the packing material in the pits 230 is solidified. Therefore, the hole-filling operation of the first surface 210 of the substrate 200 is completed. The substrate 200 at this time is shown in FIG. 5.

After the hole-filling operation of the first surface 210 of the substrate 200 is completed, the turnover rollers 171 guide the substrate 200 to move toward the winding device 192 and realize the turnover of the substrate 200. After guided by the four turnover rollers 171, the second surface 220 of the substrate 200 can be turned to face the second feeding device 140. The second feeding device 140 adds the packing material to the second surface 220 of the substrate 200. The second scraping device 150 evenly scrapes the packing material on the second surface 220 of the substrate 200 to the pits 230 on the second surface 220. The squeegee block 181 of the remaining material recycle device 180 collects the remaining material (that is, the remaining packing material) to the suction material port 182. The negative suction pipe 183 sucks the remaining material collected at the suction material port 182 and guides it to the first feeding device 110 or the second feeding device 140. Here, the remaining material recycling device 180 and the abovementioned remaining material recycling device may be the same one, and the remaining material recycling device 180 also may be another remaining material recycling device. The second drying device 160 dries the substrate 200 such that the packing material in the pits 230 is solidified. Therefore, the hole-filling operation of the second surface 220 of the substrate 200 is completed. Finally, the winding device 192 winds the substrate 200 completing the hole-filling operation on two surfaces onto the winding device 192.

In additions, when the hole-filling operation is carried out on the second surface 220 of the substrate 200, the hole-filling operation can be carried out on the first surface 210 of the substrate 200 at the same time. After the hole-filling operation of the two surfaces of the substrate is completed, the winding device 192 starts to wind the substrate 200, so as to wind the substrate 200 where the hole-filling operation is completely carried out on its two surfaces. The substrate 200, where the hole-filling operation is completed only on its first surface 210, is transported to the second feeding device 140 and the second scraping device 150, so as to continue the hole-filling operation on the second surface 220. The substrate, which is not carried out with the hole-filling operation, is transported to the first feeding device 110 and the first scraping device 120, so as to carry out the hole-filling operation on the first surface 210. The cyclic operation is continuously carried out to improve production efficiency.

As the substrate 200 does not need to be turned over manually when the hole-filling operation is carried out on the two surfaces of the substrate 200, the time of the manual turnover is saved. Furthermore, as the hole-filling operation is continuously carried out on the two surfaces of the substrate at the same time, the substrate double-surface hole-filling apparatus 100 has relatively high automation and relatively high production efficiency.

The substrate double-surface hole-filling apparatus has a turnover device turning over the substrate which needs to be carried out with hole-filling operation. Therefore, the substrate double-surface hole-filling apparatus can automatically carry out the hole-filling operation on two surfaces of the substrate without manual turnover of the substrate, thus improving production efficiency.

The above examples describe several embodiments of the present invention in details but can not be understood that they limit the patent scope of the present invention. It shall be noted that: the people skilled in the prior art, without deviation from the principle of the invention, also may give several modifications and improvements, which all shall fall within the protection scope of the present invention. Therefore, the protection scope of the present invention shall be subject to the appended claims.

What is claimed is:

1. A substrate double-surface hole-filling apparatus for carrying out a hole-filling operation on a substrate, comprising:
    a first feeder,
    a first scraping device,
    a first dryer,
    a second feeder,
    a second scraping device,
    a second dryer, and
    a turnover device,
    wherein:
        the first feeder and the first scraping device are positioned on the same side of a first surface of the substrate;
        the second feeder and the second scraping device are positioned on the same side of a second surface of the substrate;
        the first feeder is configured to add a packing material for hole-filling to a planar region of the first surface of the substrate;
        the first scraping device fills the packing material added to the first surface of the substrate to concave holes or pits of the first surface of the substrate;

the substrate filled with the packing material is dried by the first dryer, wherein the first dryer is positioned on an opposite side of the substrate from the first feeder;

the turnover device turns over the substrate from a state which the first surface faces the first feeder to another state which the second surface faces the second feeder;

the second feeder is configured to add the packing material for hole-filling to a planar region of the second surface of the substrate;

the second scraping device fills the packing material added to the second surface of the substrate to concave holes or pits of the second surface of the substrate;

the substrate filled with the packing material is dried by the second dryer, wherein the second dryer is positioned on an opposite side of the substrate from the second feeder;

the first scraping device and the second scraping device directly contact the substrate;

the first scraping device is positioned downstream of the first feeder opposite the first dryer;

the second scraping device is positioned downstream of the second feeder opposite the second dryer;

the first feeder and the second feeder are configured to drip or coat the packing material on the substrate;

the first scraping device and the second scraping device are each one of a flexible squeegee, a steel scraper, or a combination thereof;

the turnover device comprises a plurality of turnover rollers and guiding wheels;

at least two of the turnover rollers are provided downstream of the first dryer and upstream of the second dryer, wherein a first of the at least two turnover rollers is in contact with the first surface of the substrate, and wherein a second of the at least two turnover rollers is in contact with the second surface of the substrate opposite the first surface of the substrate;

the first scraping device and the first dryer are positioned on opposite sides of the substrate such that scraping and drying of the substrate with the first scraping device and the first dryer occur at least partially simultaneously; and the second scraping device and the second dryer are positioned on opposite sides of the substrate such that scraping and drying of the substrate with the second scraping device and the second dryer occur at least partially simultaneously.

2. The substrate double-surface hole-filling apparatus according to claim 1, wherein the turnover rollers guide the substrate.

3. The substrate double-surface hole-filling apparatus according to claim 1, wherein the substrate double-surface hole-filling apparatus further comprises an unwinder releasing the substrate which is wound and a winder winding the substrate.

4. The substrate double-surface hole-filling apparatus according to claim 1, wherein the substrate double-surface hole-filling apparatus further comprises a remaining material recycling device positioned on one side of the first scraping device or the second scraping device, and the remaining material recycling device recycles a remaining packing material on the surface of the substrate, wherein the remaining material recycling device is a suction remaining material recycle device, and the remaining material recycling device comprises a squeegee block for collecting the remaining material on the substrate, a suction material port positioned at an edge of the squeegee block, and a negative pressure suction pipe for guiding the remaining material collected at the suction material port away.

5. The substrate double-surface hole-filling apparatus according to claim 4, wherein the negative pressure suction pipe is connected with the first feeder or the second feeder; and the remaining material recycled in the negative pressure suction pipe reflows back to the first feeder or the second feeder.

6. The substrate double-surface hole-filling apparatus according to claim 1, wherein the substrate double-surface hole-filling apparatus further comprises a support which is positioned below the first scraping device and the second scraping device and supports the substrate.

* * * * *